(12) United States Patent
Gallerano et al.

(10) Patent No.: US 7,885,046 B1
(45) Date of Patent: Feb. 8, 2011

(54) LOW CAPACITANCE ESD PROTECTION STRUCTURE FOR HIGH SPEED INPUT PINS

(75) Inventors: Antonio Gallerano, San Jose, CA (US); Cheng-Hsiung Huang, Cupertino, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/869,805

(22) Filed: Oct. 10, 2007

Related U.S. Application Data

(60) Provisional application No. 60/851,804, filed on Oct. 10, 2006.

(51) Int. Cl.
*H02H 9/00* (2006.01)
*H02H 1/00* (2006.01)
(52) U.S. Cl. ....................................................... 361/56
(58) Field of Classification Search ................... 361/56
See application file for complete search history.

(56) References Cited

U.S. PATENT DOCUMENTS

| | | | |
|---|---|---|---|
| 6,690,557 B2 * | 2/2004 | Hung et al. | 361/56 |
| 7,279,726 B2 * | 10/2007 | Esmark et al. | 257/107 |
| 7,397,088 B2 * | 7/2008 | Naot et al. | 257/355 |
| 7,518,843 B2 * | 4/2009 | Wu et al. | 361/56 |
| 2003/0058592 A1 * | 3/2003 | Hung et al. | 361/56 |
| 2007/0063203 A1 * | 3/2007 | Hayashida | 257/81 |

* cited by examiner

*Primary Examiner*—Ronald W Leja
(74) *Attorney, Agent, or Firm*—Ward & Olivo

(57) ABSTRACT

A conventional ESD protection circuit comprises an SCR and a first diode connected in series between ground and a node or pad to be protected and a second diode connected between ground and the node to be protected. An anode of the first diode and a cathode of the second diode are connected to the node to be protected. In one embodiment of the invention, the capacitance of the second diode is reduced by forming the second diode from a PN junction between a heavily doped region of one conductivity type and a substrate region instead of a well region of the opposite conductivity type. The reduction in the capacitance of the second diode makes it possible to increase the size of the first diode and SCR, thereby decreasing their resistance, while keeping the total capacitance of the ESD circuit at or below the capacitance of the prior art ESD circuit. A second embodiment of an ESD protection comprises an SCR and a first diode connected in series between ground and node to be protected and second and third diodes connected in series between ground and the node to be protected with the anode of the second diode connected to ground. Again, the capacitance of the second diode is reduced by forming the diode from a PN junction between a heavily doped region of one conductivity type and a substrate region of the other conductivity type.

15 Claims, 2 Drawing Sheets

LOW CAPACITANCE ESD PROTECTION STRUCTURE FOR HIGH SPEED INPUT PINS

CROSS-REFERENCE TO RELATED APPLICATION

This application claims the benefit of the Oct. 10, 2006 filing date of provisional application Ser. No. 60/851,804, which is incorporated herein by reference.

BACKGROUND OF THE INVENTION

High speed input/output (I/O) pins require a low capacitance which puts severe constraints on any electrostatic discharge (ESD) circuit used to protect the I/O pins. Unfortunately, the resistance of many low capacitance ESD circuits is relatively high with the result that the ESD circuit provides only marginal ESD protection for positive zaps.

A typical ESD protection circuit 100 is shown in FIG. 1. Circuit 100 comprises a first diode 10 and a silicon controlled rectifier (SCR) 20 connected in series between an input node or lead 30 and a ground node 40 and a second diode 50 connected between input node 30 and ground node 40. An anode of the first diode is connected to input node 30 and an anode of the second diode is connected to ground node 40. In this arrangement, a positive zap is discharged through the first diode and SCR; and a negative zap is discharged through the second diode.

The first diode illustratively is formed by a PN junction between a heavily doped region of a first conductivity type and a well region of a second conductivity type. The second diode is formed by a PN junction between a heavily doped region of the second conductivity type and a well region of the first conductivity type. Preferably the first conductivity type is P and the second conductivity type is N.

Illustratively, the first diode has a capacitance of 24 femto-Farads (fF), the SCR has a capacitance of 150 fF and the second diode has a capacitance of 28 fF. As a result, the capacitance of the series combination of the first diode and SCR is 21 fF (24·150/(24+150)) and the total capacitance of the parallel combination of the first diode and SCR with the second diode is 49 fF (21+28).

SUMMARY OF INVENTION

In accordance with one embodiment of the invention, the capacitance of the second diode is reduced by forming the second diode from a PN junction between a heavily doped region of one conductivity type and a substrate region instead of a well region of the opposite conductivity type. This change reduces the capacitance substantially. The reduction in the capacitance of the second diode makes it possible to increase the size of the first diode and SCR, thereby decreasing their resistance, while keeping the total capacitance of the ESD circuit at or below the capacitance of the prior art ESD circuit.

In the case of the circuit shown in FIG. 1, the capacitance of the second diode is reduced 10 fF (about 36%) to 18 fF. Since the capacitance of the second diode is now only 18 fF, the capacitance of the first diode and SCR can be increased by 10 fF to 31 fF while still achieving a total capacitance of no more than 49 ff. The increase of 10 fF in the capacitance of the first diode and SCR is an increase of approximately 48% and since capacitance is directly proportional to area, this permits an increase in the area of the first diode and SCR by 48%. Since resistance is inversely proportional to area, this results in a reduction in the resistance of the first diode and SCR by approximately 32%.

A second embodiment of an ESD protection circuit of the invention comprises a first diode and an SCR connected in series between an input node or lead and a ground node and second and third diodes connected in series between the input node and ground node. An anode of the first diode is connected to the input node and an anode of the second diode is connected to the ground node. Again, the capacitance of the second diode is reduced by forming the diode from a PN junction between a heavily doped region of one conductivity type and a substrate region of the other type; and this reduction in capacitance in one branch of the circuit allows the capacitance to be increased and the resistance decreased in the other branch of the circuit while maintaining the same overall capacitance.

BRIEF DESCRIPTION OF DRAWING

These and other objects, features and advantages of the invention will be more readily apparent from the following Detailed Description in which.

DETAILED DESCRIPTION

Figure 2:
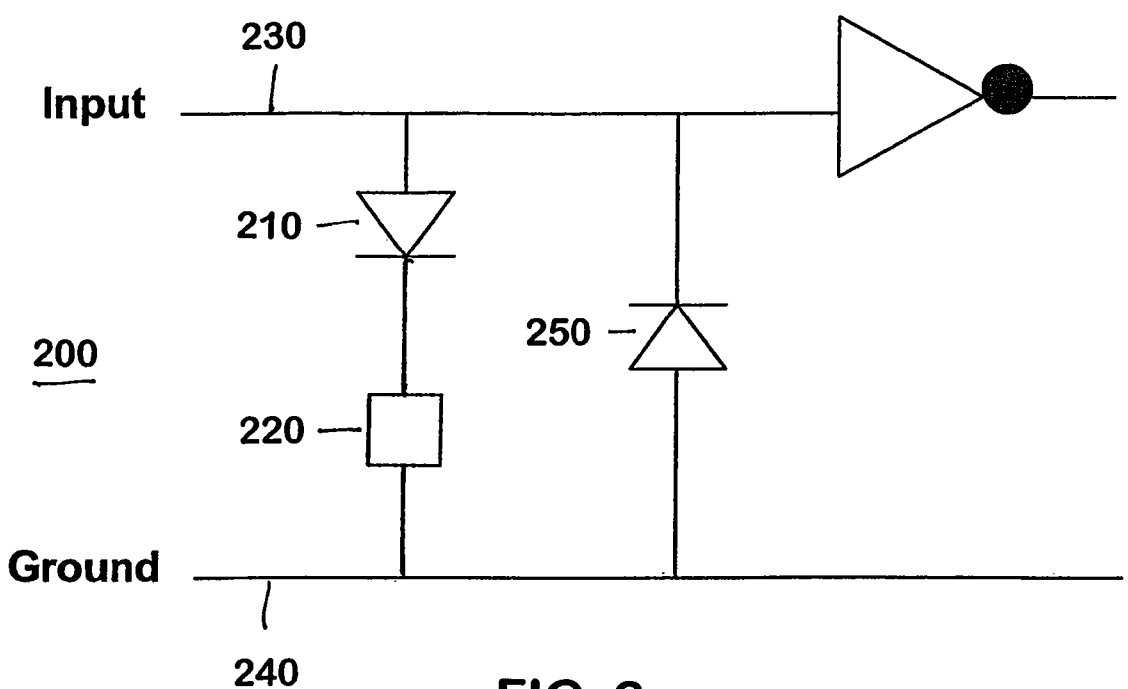
FIG. 2 is a schematic diagram of a first illustrative embodiment of the invention.

FIG. 2 is a schematic diagram of a first ESD protection circuit 200 of the present invention. Circuit 200 comprises a first diode 210 and a silicon controlled rectifier (SCR) 220 connected in series between an input node or lead 230 and a ground node 240 and a second diode 250 connected between input node 230 and ground node 240. An anode of the first diode 210 is connected to input node 230 and an anode of the second diode is connected to ground node 240. In this arrangement, a positive zap is discharged through the first diode and SCR; and a negative zap is discharged through the second diode.

In accordance with this embodiment of the invention, the capacitance of the second diode is reduced by forming the second diode from a PN junction between a heavily doped region of one conductivity type and a substrate region of the opposite conductivity type. The substrate is lightly doped or native and in any event is doped much less than the well region. Preferably, the heavily doped region is N-type and the substrate is P-type. This change reduces the capacitance substantially. For example, the capacitance may be reduced about 10 fF from 28 fF to 18 fF.

The reduction in the capacitance of the second diode makes it possible to increase the size of the first diode and SCR, thereby decreasing their resistance, while keeping the total capacitance of the ESD circuit at or below the capacitance of the prior art ESD circuit. In particular, since the capacitance of the second diode is now only 18 fF, the capacitance of the first diode and SCR can be increased by 10 fF. Thus, where the invention is applied to modifying the circuit of FIG. 1, the capacitance of the first diode and SCR may be increased from 21 fF to 31 fF while still achieving a total capacitance of no more than 49 ff. The increase of 10° F. in the capacitance of the first diode and SCR is an increase of approximately 48% and since capacitance is directly proportional to area, this permits an increase in the area of the first diode and SCR by 48%. Since resistance is inversely proportional to area, this results in a reduction in the resistance of the first diode and SCR by approximately 32%.

Figure 3:
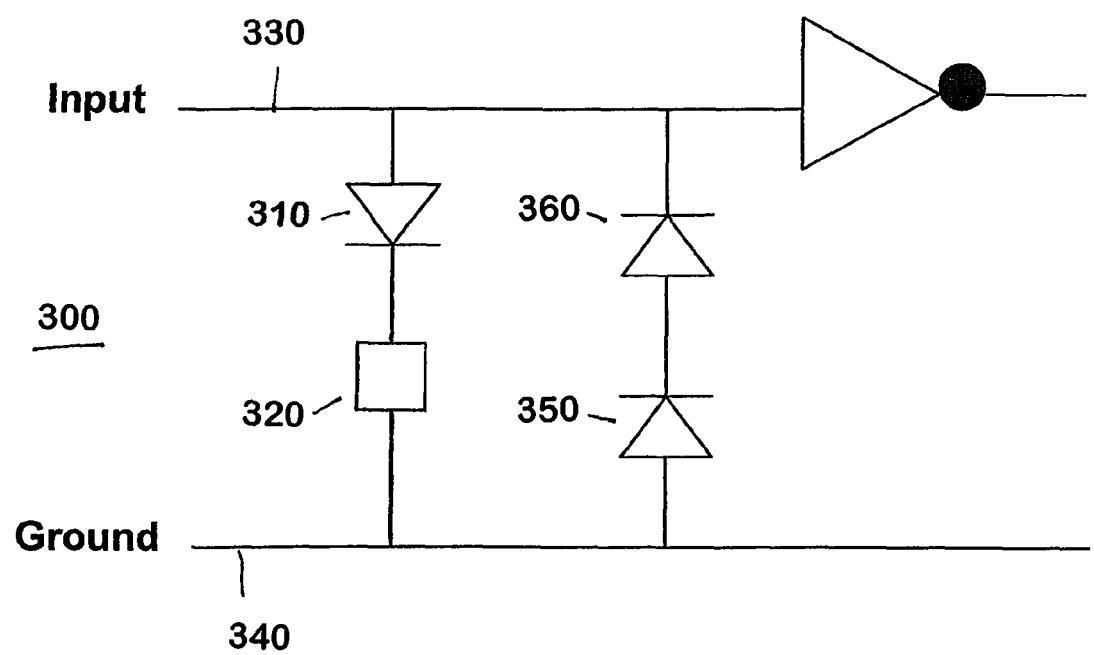
FIG. 3 is a schematic diagram of a second illustrative embodiment of the invention.

A second embodiment of an ESD protection circuit 300 of the invention is shown in FIG. 3. This circuit solution is better suited to ESD protection schemes that use power clamps capable of keeping the voltage between power rails at a sufficiently low voltage during ESD. Circuit 300 comprises a first diode 310 and an SCR 320 connected in series between an input node or lead 330 and a ground node 340 and a second diode 350 and a third diode 360 connected in series between input node 330 and ground node 340. An anode of the first diode is connected to the input node and an anode of the second diode is connected to the ground node. Again, a positive zap is discharged through the first diode and SCR and a negative zap is discharged through the second and third diodes.

The first and third diodes illustratively are formed by PN junctions between a heavily doped region of a first conductivity type and a well region of the second conductivity type. The second diode is formed by a PN junction between a heavily doped region of the second conductivity type and a substrate of the first conductivity type. Again, the substrate is lightly doped or native and is doped much less than the well region of the first conductivity type. Preferably the first conductivity type is P and the second conductivity type is N.

Illustratively, the second diode has a capacitance of 18 fF and the third diode has a capacitance of 24 fF. As a result, the capacitance of the series combination of the second and third diodes is only 10 fF (18·24/(18+24)).

Figure 1:
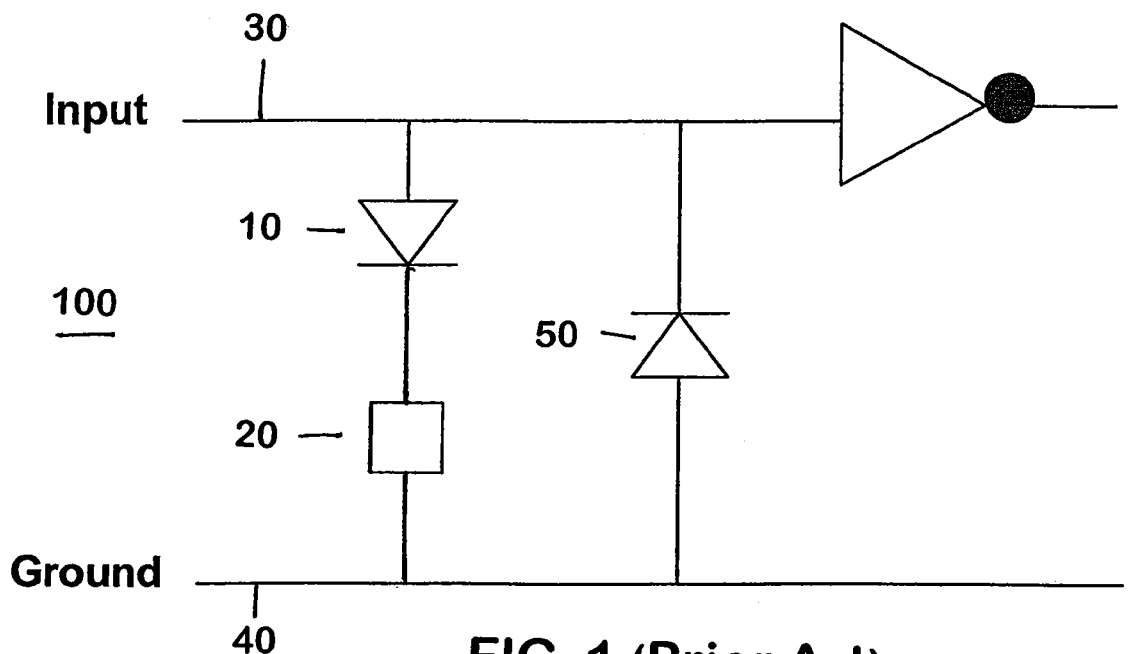
FIG. 1 is a schematic diagram illustrating a prior art ESD circuit.

Thus, when the invention of the second embodiment is applied to modifying the circuit of FIG. 1, the capacitance of the first diode and SCR may be increased by up to 18 fF, thereby decreasing their resistance, while keeping the total capacitance of the ESD circuit at or below the capacitance of the prior art ESD circuit. In particular, since the capacitance of the series combination of the second and third diodes is only 10 fF, the capacitance of the first diode and SCR can be increased by 18 fF to 39 fF while still achieving a total capacitance of no more than 49 fF. The increase of 18 fF in the capacitance of the first diode and SCR is an increase of approximately 86% and since the capacitance is directly proportional to area, this permits an increase in the area of the first diode and SCR by approximately 86%. Since resistance is inversely proportional to area, this results in a reduction in the resistance of the first diode and SCR by approximately 46%

Advantageously, the circuits of FIGS. 2 and 3 are formed using conventional processing steps with appropriate masking to define the diodes and SCR structures of the circuits. Connections are typically made through the interconnect layers and vias formed on the surface of the substrate. In particular, the first diode and SCR are connected together in series through one or more interconnect layers and vias formed on the surface of the substrate. Likewise, the anode of the first diode is connected to the input node to be protected and the cathode of the SCR is connected to the ground node. In the case of the embodiment of FIG. 2, the anode of the second diode is connected to the ground node and the cathode is connected to the node to be protected. In the case of the embodiment of FIG. 3, the second and third diodes are connected in series and the anode of the second diode is connected to ground and the cathode of the third diode is connected to the node to be protected.

As will be apparent to those skilled in the art, numerous variations of the invention may be practiced within the spirit and scope of the claims.

What is claimed is:

1. An electrostatic discharge (ESD) protection circuit comprising:

a first diode and an SCR connected in series between an input node and a ground node, an anode of the first diode being connected to the input node, said first diode and SCR having a first capacitance and a first resistance; and a second diode connected between the input node and the ground node, an anode of the second diode being connected to the ground node, said second diode being formed at a junction between a highly doped region of a first conductivity type and a substrate of a second conductivity type, said second diode having a second capacitance, said first diode and SCR and said second diode having a total capacitance that is no more than what the total capacitance would be if the second diode were formed at a junction between a heavily doped region of a first conductivity type and a well region of a second conductivity type but the second capacitance is less than what it would be, the first capacitance is greater than what it would be, and the first resistance is less than what it would be if the second diode were formed at a junction between a heavily doped region of a first conductivity type and a well region of a second conductivity type.

2. The ESD protection circuit of claim 1 wherein the first conductivity type is N and the second conductivity type is P.

3. The ESD protection circuit of claim 1 further comprising a third diode connected in series between the second diode and the input node.

4. An electrostatic discharge (ESD) protection circuit comprising:

a first diode and an SCR connected in series between an input node and a ground node, an anode of the first diode being connected to the input node said first diode and SCR having a first capacitance and a first resistance; and second and third diodes connected in series between the input node and the ground node, an anode of the second diode being connected to the ground node, said second diode being formed at a first junction between a highly doped region of the first conductivity type and a substrate of the second conductivity type, said second diode having a second capacitance said first diode and SCR and said second diode having a total capacitance that is no more than what the total capacitance would be if the second diode were formed at a junction between a heavily doped region of a first conductivity type and a well region of a second conductivity type but the second capacitance is less than what it would be, the first capacitance is greater than what it would be, and the first resistance is less than what it would be if the second diode were formed at a junction between a heavily doped region of a first conductivity type and a well region of a second conductivity type.

5. The ESD protection circuit of claim 4 wherein said third diode is formed at a second junction between a highly doped region of the second conductivity type and a well region of the first conductivity type.

6. The ESD protection circuit of claim 4 wherein the first conductivity type is N and the second conductivity type is P.

7. A method of forming an ESD protection circuit comprising the steps of:

connecting a first diode and a semiconductor controlled rectifier (SCR) in series between a node to be protected and ground with an anode of the first diode connected to the node to be protected, said first diode and SCR having a first capacitance and first resistance, forming a second diode at a PN junction between a heavily doped region of a first conductivity type and a substrate of a second conductivity type, said second diode having a second capacitance, and connecting the second diode between the node to be protected and ground with an anode of the second diode connected to ground said first diode and SCR and said second diode having a total capacitance that is no more than what the total capacitance would be if the second diode were formed at a junction between a heavily doped region of a first conductivity type and a well region of a second conductivity type but the second capacitance is less than what it would be, the first capacitance is greater than what it would be, and the first resistance is less than what it would be if the second diode were formed at a junction between a heavily doped region of a first conductivity type and a well region of a second conductivity type.

8. The method of claim 7 further comprising the step of connecting a third diode in series with the second diode between the node to be protected and ground.

9. The method of claim 7 wherein the first conductivity type is N and the second conductivity type is P.

10. The method of claim 1 wherein the second capacitance is reduced about 36%, and the first capacitance is increased about 48%.

11. The method of claim 10 wherein the first resistance is reduced about 32%.

12. The method of claim 4 wherein the second capacitance is reduced about 36%, and the first capacitance is increased about 48%.

13. The method of claim 12 wherein the first resistance is reduced about 32%.

14. The method of claim 7 wherein the second capacitance is reduced about 36%, and the first capacitance is increased about 48%.

15. The method of claim 14 wherein the first resistance is reduced about 32%.

* * * * *